(12) United States Patent
Appelt et al.

(10) Patent No.: US 10,670,670 B2
(45) Date of Patent: Jun. 2, 2020

(54) HIGH-QUALITY COIL

(71) Applicant: FORSCHUNGSZENTRUM JÜLICH GMBH, Jülich (DE)

(72) Inventors: Stephan Appelt, Aachen-Soers (DE); Martin Süfke, Aachen (DE); Bernd Alexander Liebisch, Aachen (DE)

(73) Assignee: Forschungszentrum Jülich GmbH (DE)

( * ) Notice: Subject to any disclaimer, the term of this patent is extended or adjusted under 35 U.S.C. 154(b) by 0 days.

(21) Appl. No.: 15/509,544

(22) PCT Filed: Sep. 17, 2015

(86) PCT No.: PCT/EP2015/071345
§ 371 (c)(1),
(2) Date: Mar. 8, 2017

(87) PCT Pub. No.: WO2016/042086
PCT Pub. Date: Mar. 24, 2016

(65) Prior Publication Data
US 2017/0285115 A1    Oct. 5, 2017

(30) Foreign Application Priority Data
Sep. 19, 2014   (DE) .................. 10 2014 218 874

(51) Int. Cl.
*G01R 33/02* (2006.01)
*H01F 27/28* (2006.01)
*G01R 33/00* (2006.01)

(52) U.S. Cl.
CPC .............. *G01R 33/02* (2013.01); *H01F 27/28* (2013.01); *G01R 33/0052* (2013.01)

(58) Field of Classification Search
CPC ...... G01R 33/02; G01R 33/0052; H01F 27/28
See application file for complete search history.

(56) References Cited

U.S. PATENT DOCUMENTS 4,837,501 A * 6/1989 Fry .......................... G01D 5/22
324/610
5,742,213 A   4/1998 Reynolds
(Continued)

FOREIGN PATENT DOCUMENTS

DE         19742380 A1    4/1999
DE       102008016488 A1   10/2009
(Continued)

OTHER PUBLICATIONS

International Preliminary Report on Patentability, International Application No. PCT/EP2015/071345, dated Mar. 19, 2017, 6 pages.
(Continued)

*Primary Examiner* — Akm Zakaria
(74) *Attorney, Agent, or Firm* — Barnes & Thornburg LLP

(57) ABSTRACT

The problem addressed by the invention is that of providing a coil having advantageous properties for an oscillating circuit, in particular for a measuring device for electromagnetic signals. This problem is solved in that the coil comprises an electric conductor, the ends of which form the two terminals of the coil. Wound sections of the electric conductor are twisted together, that is to say wound helically around one another. The electric conductor is in principle surrounded by insulation, for example made of plastic or varnish. As a result of the twisting, increases in spacing between adjacent conductor sections within the windings are achieved. This results in an improved quality of the coil.

16 Claims, 3 Drawing Sheets

(56) References Cited

U.S. PATENT DOCUMENTS

| | | | | |
|---|---|---|---|---|
| 8,035,935 | B2* | 10/2011 | Ramirez | H02H 7/04 |
| | | | | 361/35 |
| 8,284,007 | B1* | 10/2012 | Langner | H04L 25/0276 |
| | | | | 324/117 R |
| 9,496,924 | B2* | 11/2016 | Aber | H01Q 1/273 |
| 2009/0219127 | A1* | 9/2009 | Tomonari | H01F 19/04 |
| | | | | 336/192 |
| 2011/0279209 | A1* | 11/2011 | Schoessow | H01F 19/08 |
| | | | | 336/192 |
| 2012/0038444 | A1* | 2/2012 | Wu | H01F 27/02 |
| | | | | 336/90 |
| 2012/0322309 | A1 | 12/2012 | Xu et al. | |

FOREIGN PATENT DOCUMENTS

| | | |
|---|---|---|
| EP | 0092018 A1 | 4/1998 |
| GB | 2382876 A | 6/2003 |
| JP | 2009231797 A | 10/2009 |
| JP | 48-18637-02 U1 | 11/2011 |
| JP | 2014120325 A | 6/2014 |

OTHER PUBLICATIONS

Japanese Office Action for Application No. JP2017-535126, dated Apr. 8, 2019, 6 pages.

* cited by examiner

HIGH-QUALITY COIL

CROSS-REFERENCE TO RELATED APPLICATIONS

This application is the U.S. national phase of PCT/EP2015/071345, filed on Sep. 17, 2015, which claims priority to German Patent Application 102014218874.1, filed on Sep. 19, 2014. The disclosures of both German Patent Application 102014218874.1 and PCT/EP2015/071345 are hereby incorporated herein by reference in their entireties.

BACKGROUND OF INVENTION

The invention concerns a coil. A coil is formed by at least one winding of an electric conductor. The electric conductor can be wound up on a coil body, which does not affect the properties of the coil and thus consists for example of plastic. The coil can comprise a core, around which the electric conductor is wound one or several times. The core changes the properties of the coil, namely in particular the inductance and quality. The both ends of the electric conductors form the both terminals of the coil.

As electric conductor is used for example a wire or a braid. A braid consists of a multiplicity of for example parallel running single wires. The single wires can run spirally, that is to say in a shape of a helix.

In order to allow measuring electromagnetic signals, a therefore suitable measuring device comprises an electric oscillating circuit (resonant circuit). An oscillating circuit comprises a coil and a capacitance. In order to obtain an oscillating circuit with low damping, coils with high quality are needed among others. The quality of a coil is the product of the measurement frequency and the ratio of inductance to resistance.

A coil with a wound electric conductor, whose ends form the both electric terminals of the coil, is known from the U.S. Pat. No. 512,340.

Besides a coil with an electric conductor and two electric terminals there are components in the field of power supply and transformators with a plurality of wound together electric conductors with a plurality of electric terminals (U.S. Pat. No. 5,640,314). Electric conductors of such components with at least four electric terminals can be twisted (RF Circuit Design, 2nd Edition, Christopher Bowick, ISBN 978-0750685184).

It is object of the invention to provide a coil with advantageous properties for an oscillating circuit, in particular for a measuring device for electromagnetic signals.

The problem of the invention is solved by means of a coil with the features of the claim 1. Advantageous embodiments result from the dependent claims.

BRIEF SUMMARY OF THE INVENTION

The coil comprises an electric conductor, whose ends form the both terminals of the coil. Wound sections of the electric conductor are twisted together, that is to say spirally (helically) wound around each other. The electric conductor is basically surrounded by an insulation, for example made of plastic or varnish.

By means of the twisting, increases in spacing between adjacent conductor sections within the windings are achieved. This results in an improved quality of the coil.

In an oscillating circuit, such a coil with improved quality contributes to improving the overall quality of the oscillating circuit.

When a measuring device for the measurement of electromagnetic signals comprises such an oscillating circuit, a measuring device is obtained that allows improved measurement of an electromagnetic signal. In particular, the signal-to-noise ratio of such a measuring device can be improved.

An electric conductor can be a wire or a braid. A braid is advantageous for the use in an oscillating circuit. The electric conductor can be manufactured of a multiplicity of wires or braids, which were connected together to one electric conductor of the coil.

In one embodiment of the invention, two electric conductors, which are initially electrically separate from each other, are wound around one another. That is to say for example two wires or two braids or one braid and one wire are twisted together. One end of the one electric conductor is electrically connected with one end of the other electric conductor, namely in particular with an opposite end. The electrical connection can be for example a solder joint or a clamping connection. The both remaining ends form the both terminals of the coil. The sections being twisted together are wound into a coil, i.e. wound up for example on a coil body. A coil that was manufactured in this way enables manufacturing a high quality coil with little technical expenditure.

Wires or braids of the coil advantageously consists of copper, silver or gold. This leads to a low resistance and therefore to a high quality of the coil and thus to a high quality of the oscillating circuit, which comprises such a coil. This contributes to further improve the mentioned signal-to-noise ratio in such a measuring device with such an oscillating circuit.

Preferably, the coil is formed by at least one braid, whose thin wires are electrically insulated from each other, namely in particular by means of insulating varnish layers in order to thereby obtain a further improved mentioned signal-to-noise ratio of a measuring device for the measurement of electromagnetic signals. The single wires are thus separated from each other within the windings by electric insulation layers.

Two interwoven or twisted electric conductors, such as for example copper wires or copper braids, of equal length are in one embodiment wound with few windings around a core, preferably a ferrite core. The number of windings depends on chosen detection frequencies (rates). Up to 150 windings have turned out to be suitable for low frequencies of up to 20 kHz. For low frequencies, the coil comprises at least 5 windings, advantageously at least 10 windings. A winding is present, if the electric conductors that are twisted together were wound one time for example around a coil body or around a coil core. The intertwined winding pair of multi-wired copper or braid wire advantageously minimize skin and proximity effects and the therewith connected AC resistance significantly.

The coil has in one embodiment a plurality of windings of an electric conductor as well as a center tapping. A center tapping is an additional electric terminal, which from the electric viewpoint is arranged between both terminals of the electric conductor.

By means of the center tapping, oscillation tendencies of an oscillating circuit comprising a coil according to the invention can be suppressed by grounding the center tapping, in fact particularly well, if the center tapping is arranged from the electric viewpoint roughly centered, preferably exactly centered. This positively affects the signal-to-noise ratio when the oscillating circuit is used for the measurement of electromagnetic signals. Such a coil with center tapping represents an independent invention, which can be combined alone or in various combination with the above mentioned features.

A coil with center tapping is of particular advantage, when the coil is part of an oscillating circuit in a measuring device for electromagnetic signals and the measurement signal is amplified by means of a high-resistance differential amplifier. In particular, by means of this combination, a particular good signal-to-noise ratio is achieved.

For manufacturing a coil with center tapping, which represents an independent invention, for example two wires or braids (first and second wire or first and second braid, respectively) are twisted together or only arranged straight-lined in parallel to each other. Subsequently, the both wires, which are twisted together or running in parallel and straight-lined, are wound, so for example around a core. A terminal of the first electric conductor as well as an opposite terminal of the second electric conductor are electrically connected together and provided as third terminal, which then forms the center tapping that is grounded for a use in an oscillating circuit. The both other remaining terminals then form the both terminals of the coil. In this way, independent from a twisting, advantages can be achieved, which results in an improved signal-to-noise ratio at a measuring device for electromagnetic signals. In particular, a center tapping can thereby be arranged exactly centered, if the wound conductor path sections of two conductors, which as described above were electrically connected for providing of a terminal of the center tapping, are equally long. Preferably, the length difference between the both wound conductor path sections amounts to not more than 10%, preferably not more than 1%, particularly preferred less than $\frac{1}{1000}$, in order to appropriately arrange a center tapping. A signal-to-noise ratio at a measuring device for measurement of electromagnetic signals can thereby be considerably improved.

The both conductor path sections, which are twisted together or running in parallel to each other in order to be together wound, can be mechanically connected with each other, so for example by means of gluing or by casting in resin, by spinning around with fiber material or insertion in a tube (hose). The alternating current resistances of the both conductor path sections and/or the inductances of the both conductor path sections are preferably equal in order to allow advantageously conducting measurements with a measuring device for electromagnetic signals, namely in particular when having a high-resistance differential amplifier like in case of an instrument amplifier.

A coil according to the invention is basically an independent component that in case of a center tapping basically comprises only one electric conductor with three electric terminals. If no center tapping is present, the object basically comprises only one electric conductor with exactly two electric terminals.

A measuring device with good signal-to-noise ratio comprises an electromagnetic oscillating circuit with a pickup coil, a preferably tunable (adjustable) capacitance and a filter coil. As filter coil serves the coil according to the claims with center tapping. By means of the pickup coil, the electromagnetic signal that is to be detected is recorded. Filter coil and capacitance advantageously show high quality of at least 100, preferably of at least 200, particularly preferred at least 500. The measurement signal is then available at the both terminals of the filter coil with good signal-to-noise ratio.

A measuring device is obtained, which acts as a bandpass filter with a relatively narrow band. Having appropriate tuning, a desired signal is let pass through. Noise signals in adjacent frequency areas are filtered out such that already for this reasons a good signal-to-noise ratio is achieved. But above all, an appropriate voltage amplification succeeds, which decisively contributes to a good signal-to-noise ratio.

It can be measured very flexibly and robustly during practical use. The entire necessary hardware allows miniaturization and allows to conduct mobile EPR or NMR spectroscopy in a frequency range of 1 kHz-40 MHz with micro coils without the use of superconductive magnets. In particular, an EPR or NMR spectroscopy at frequencies below 10 MHz and above all also below of 1 MHz can be conducted in order to allow keeping the instrumental (device) expenditures low. Fields of applications are the chemical analysis, the sensor technology as well as medical science.

If a coil comprises besides two terminals for the coil also a third terminal for the center tapping, the alternating current resistances and/or inductances between terminals are preferably for already mentioned reasons equal, namely on the one hand the section between the one coil terminal and the terminal of the center tapping and on the other hand between the section between the other coil terminal and the terminal for the center tapping. The both sections thus resemble (equal) with respect to the mentioned electrical properties.

BRIEF DESCRIPTION OF THE DRAWINGS

It shows.

DETAILED DESCRIPTION OF THE INVENTION

Figure 1:
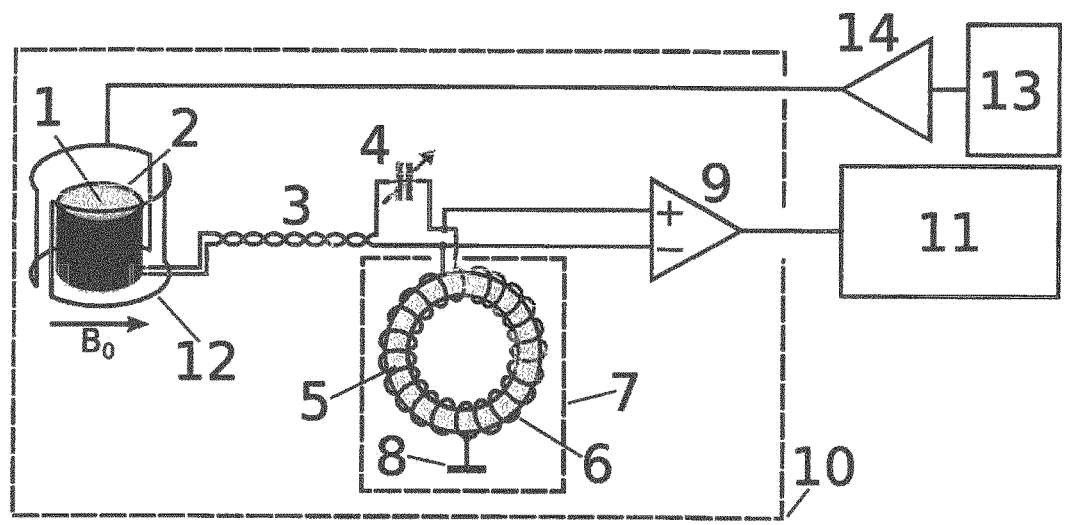
FIG. 1: Setup of a measuring device with coil with center tapping.

The FIG. 1 shows a pickup coil 2 of any structural form that is wound around a sample 1. The pickup coil 2 is connected to an external high-quality filter coil 6 with a ferrite core 5 through a low-loss transfer line 3 and an tunable capacitance (capacitor) 4 of high quality (Qc~10000). The transfer line comprises two electric conductors, which each consist either of a multi-wired copper line with large cross section (>1 mm2) and minimal capacity dielectrical loss due to a Teflon insulation or of thick low-resistance stranded wire (1000×0.05 mm) with negligible skin and proximity effect at frequencies below 1 MHz. The both conductors are wound around one another as shown, thus twirled or twisted together, respectively. In case of a Teflon insulation, every conductor is encased by Teflon. Additionally, the both conductors of the transfer line 3 that are twisted together are located in a Teflon casing.

For example, an oscillating NMR signal that is recorded by the pickup coil (so called free induction decay, FID) is conducted via the transfer line 3 with low loss to the filter coil 6. Due to the high quality QE of the filter coil 6, the NMR signal is compared to the noise by the reducing factor Qred=QE/(1+RI/RE)>>100 inflated with RI=alternating current resistance of the pickup coil and RE=alternating current resistance of the filter coil. The alternating voltage at the filter coil is conducted through two electric conducting connections into the inverting and non-inverting entrance of a differential amplifier 9 and further amplified there. In order to suppress the oscillating tendency of the very sensitive resonator in conjunction with the differential amplifier 9, a grounded center tapping 8 at the filter coil 6 is provided.

Furthermore, the center tapping 8 provides for the draining of the technically unavoidable bias currents of the differential amplifier 9.

The filter coil 6 is separately magnetically shielded by means of a shielding 7.

Figure 2:
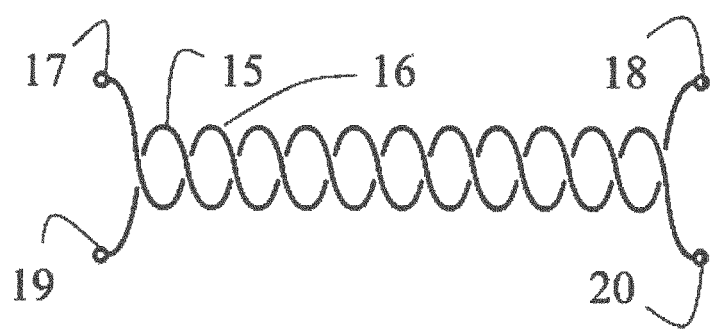
FIG. 2: Electric conductors that are twisted together for a coil with center tapping.

In the FIG. 2, two electric conductors 15 and 16, which are twisted together, are shown as they are used for the filter coil 6. The both electric conductors 15 and 16 have equal or at least very similar resistance values and equal inductance. The electric conductors 15 and 16 are electrically insulated from one another. Moreover, the both electric conductors 15 and 16 are equally long. The twisted wires 15 and 16 are together wound around the core 5. One end of the one electric conductor 15, such as for example the in the FIG. 2 left shown end 19, and the opposite end of the other conductor 16, thus then the right shown end 18, are electrically connected together and thereby form the center tapping 8 (see FIG. 4), which is grounded. The remaining ends 17 and 20 of the electric conductors 15 and 16 are then connected on the one hand with the preferably tunable capacitance 4 and on the other hand with an electric conductor of the transfer line 3. The ends 17 and 20 thus form the both terminals for the coil 6. The ends 18 and 19 that are electrically connected together form the center tapping 8.

Figure 3:
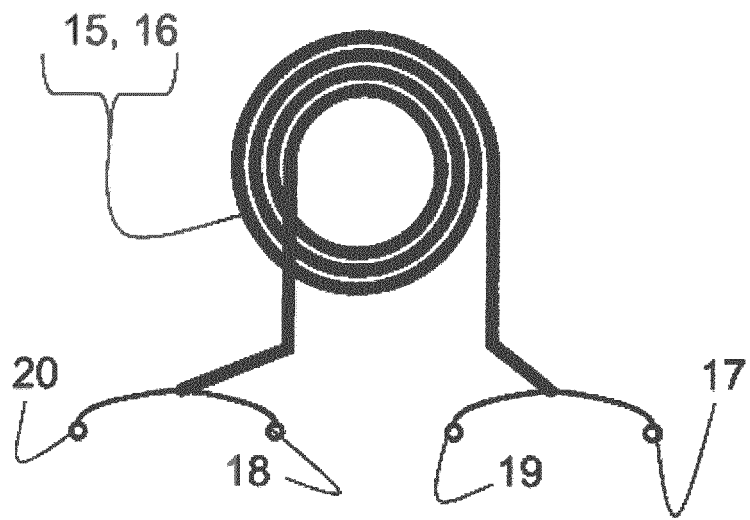
FIG. 3: Conductor paths wound into a coil.

The FIG. 3 illustrates winding of the both electric conductors 15 and 16, for example around a coil body.

Figure 4:
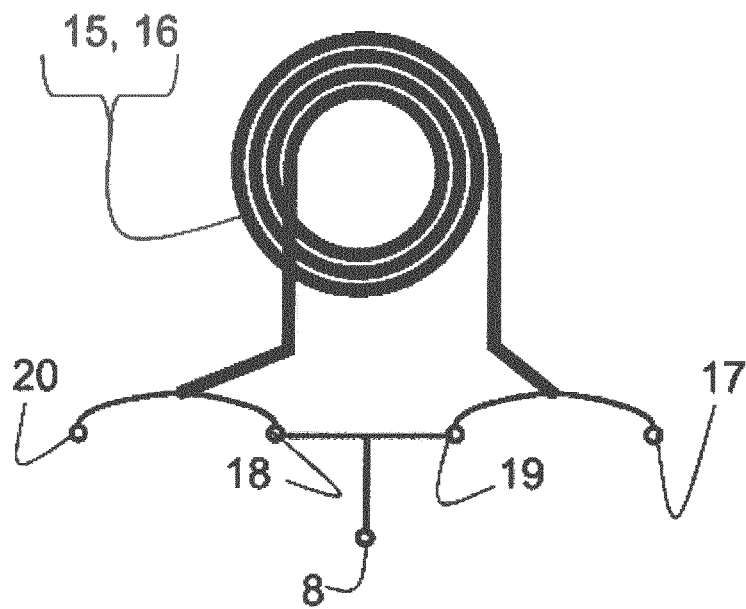
FIG. 4: Coil with center tapping.

The FIG. 4 illustrates a possible shape of a wound electric conductor, consisting of conductors 15, 16 that are electrically connected together as well as the terminals 17, 18, 19 and 20 resulting thereof. The terminals 18 and 19 were electrically connected in one working step and form the center tapping. The terminals 17 and 20 represent the terminals for the coil. The electric conductors 15 and 16 can initially also run in parallel, thus were not twisted together in order to wind a coil thereof with advantageous properties due to the center tapping, which represents an independent invention independent from the main claim.

Figure 5:
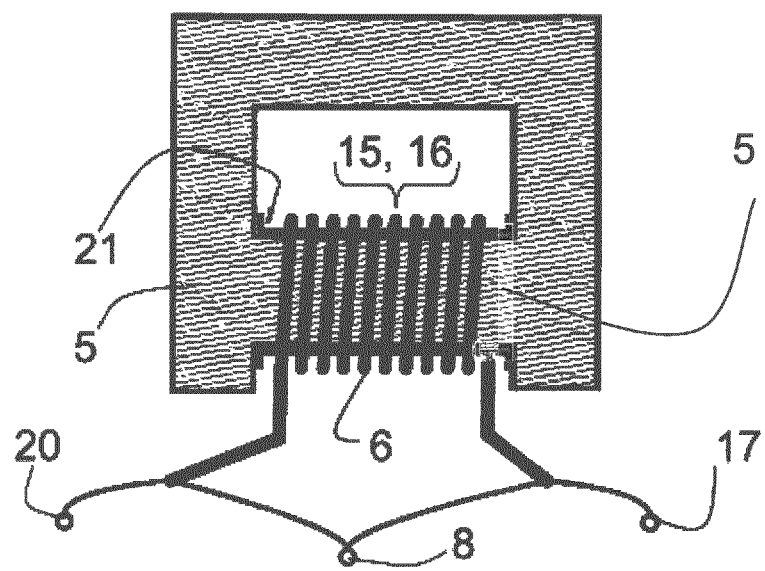
FIG. 5: Coil with center tapping and coil core.

The FIG. 5 shows a coil that was manufactured in this way with a coil body 21 and a coil core 5.

A filter coil 6 with ferrite core 5 can be small and can be manufactured with low technical effort and therefore be low-priced. Qualities up to ~500 are realizable.

The invention claimed is:

1. A coil comprising:
a first electric conductor and a second electric conductor, wherein the first electric conductor comprises a first wound section and the second electric conductor comprises a second wound section;
wherein the first and second wound sections are twisted together and are electrically connected together such that currents in the first and second wound sections flow in the same direction;
wherein the first and second electric conductors each have a first end and a second end;
wherein the first end of the first electric conductor forms a first terminal and the first end of the second electric conductor forms a second terminal;
wherein the second end of the first electric conductor and the second end of the second electric conductor are electrically connected together to form a tapping; and
wherein the first and second electric conductors are equally long, alternating current resistances of the first and second electric conductors are equal, and inductances of the first and second electric conductors are equal.

2. The coil of claim 1, wherein the first and second electric conductors, which are twisted together, are wound around a core, which in particular consists of ferrite.

3. The coil of claim 1, wherein each of the first and second electric conductors of the coil is a braid.

4. The coil of claim 3, wherein the first and second electric conductors are electrically insulated from each other by means of electrically insulating varnish layers.

5. The coil of claim 1, wherein the first and second electric conductors of the coil consists of copper, silver or gold.

6. The coil of claim 1, wherein the coil has 5 to 150 windings.

7. The coil of claim 1, wherein a quality factor of the coil amounts to more than 500.

8. The coil of claim 1, wherein the coil has at most three electric terminals, and wherein the alternating current resistances and/or the inductances between terminals are equal.

9. An electric oscillating circuit comprising a coil including first and second electric conductors,
wherein the first electric conductor comprises a first wound section and the second electric conductor comprises a second wound section,
wherein the wound sections of the first and second electric conductors are twisted together and are electrically connected together such that currents in the first and second wound sections flow in the same direction,
wherein the first and second electric conductors each have a first end and a second end,
wherein first ends of the first and second electric conductors form terminals of the coil,
wherein second ends of the first and second electric conductors, the second ends arranged opposite the first ends, are electrically connected together to form a center tapping, and
wherein first and second electric conductors are equally long, alternating current resistances of the first and second electric conductors are equal, and/or inductances of the first and second electric conductors are equal.

10. A measuring device for the measurement of electromagnetic signals comprising:
an electric oscillating circuit comprising a coil including at least two electric conductors; and
a differential amplifier which amplifies a measurement signal of the measurement device,
wherein wound sections of the at least two electric conductors are twisted together and are electrically connected together,
wherein first ends of the at least two electric conductors form terminals of the coil,
wherein second ends of each of the at least two electric conductors, the second ends disposed opposite the first ends, are electrically connected together to form a center tapping, and
wherein the at least two electric conductors are equally long, alternating current resistances of the at least two electric conductors are equal, and/or inductances of the at least two electric conductors are equal.

11. The coil of claim 1, wherein the second ends of the first and second electric conductors are in direct contact with one another to form the center tapping.

12. The electric oscillating circuit of claim 9, wherein the second ends of the first and second electric conductors are in direct contact with one another to form the center tapping.

13. The electric oscillating circuit of claim 9, wherein the first and second electric conductors are aligned in an opposite direction such that the first end of the first electric conductor and the second end of the second electric conductor are positioned at a first end of the coil, and the second end of the first electric conductor and the first end of the second electric conductor are positioned at a second end of the coil.

14. The measuring device of claim 10, wherein the second ends of the first and second electric conductors are in direct contact with one another to form the center tapping.

15. The measuring device of claim 10, wherein two electric conductors of the of the at least two electric conductor are aligned in an opposite direction such that the first end of a first electric conductor of the two electric conductors and the second end of a second electric conductor of the two electric conductors are positioned at a first end of the coil, and the second end of the first electric conductor and the first end of the second electric conductor are positioned at a second end of the coil.

16. The measuring device of claim 10, wherein the coil of the electric oscillating circuit does not have a mutual inductance with another coil.

* * * * *